United States Patent [19]
Rogers

[11] Patent Number: 6,005,369
[45] Date of Patent: Dec. 21, 1999

[54] METHOD AND APPARATUS FOR TESTING A VEHICLE CHARGE STORAGE SYSTEM

[75] Inventor: Wesley A. Rogers, Grosse Pointe Park, Mich.

[73] Assignee: Electronic Development, Inc., Grosse Point Park, Mich.

[21] Appl. No.: 09/067,172

[22] Filed: Apr. 27, 1998

Related U.S. Application Data

[63] Continuation-in-part of application No. 08/680,771, Jul. 16, 1996, Pat. No. 5,744,938.

[51] Int. Cl.[6] .................................................. H01M 10/48
[52] U.S. Cl. ..................................... 320/134; 320/DIG. 18
[58] Field of Search ..................................... 320/127, 128, 320/132, 134, 136, DIG. 18, DIG. 21; 340/636; 429/90; 324/425, 426, 427, 432

[56] References Cited

U.S. PATENT DOCUMENTS

| | | | |
|---|---|---|---|
| 5,032,825 | 7/1991 | Kuznicki | 320/136 X |
| 5,479,085 | 12/1995 | Honda et al. | 320/134 |
| 5,698,983 | 12/1997 | Arai et al. | 320/DIG. 21 X |
| 5,721,688 | 2/1998 | Bramwell | 320/128 X |
| 5,744,938 | 4/1998 | Rogers | 320/134 |

*Primary Examiner*—Edward H. Tso
*Attorney, Agent, or Firm*—Orrick Herrington & Sutcliffe, LLP

[57] ABSTRACT

Method and apparatus for accurately measuring charge storage system operating conditions in a vehicle. A measurement circuit produces an electrical response at an output which varies linearly with battery voltage levels. The circuit is calibrated to provide an output only for a voltage range above a specified battery voltage level in order to improve the resolution in detecting these levels using a standard electrical level detector such an ammeter or voltmeter. The measurement circuit is connected to a display circuit for indicating at least one charge storage system operating condition based on the terminal voltage of the battery. The measurement circuit also includes an output damper to limit the large, rapid output variations experienced during vehicle start and circuitry for compensating for variations in circuit performance due to temperature variations.

22 Claims, 5 Drawing Sheets

METHOD AND APPARATUS FOR TESTING A VEHICLE CHARGE STORAGE SYSTEM

This is a continuation-in-part of application Ser. No. 08/680,771 filed Jul. 16, 1996, now U.S. Pat. No. 5,744,938, entitled Method And Apparatus For Testing A Vehicle Charge Storage System, which is assigned to the assignee of the present invention.

FIELD OF THE INVENTION

This invention relates generally to vehicle charge storage systems. More particularly, the present invention concerns a method and apparatus for accurately measuring the operating characteristics of components in a vehicle charge storage system and for electronically measuring the electrolyte specific gravity of a battery.

BACKGROUND OF THE INVENTION

The operating condition of a charge storage system which is included in a vehicle, such as, for example, an automobile, truck, aircraft or powerboat, may be determined by evaluating the battery percent charge level, the battery health and/or the charging system health. Alternatively, the electrolyte specific gravity of a battery may be measured for purposes of determining the charge level.

The electrolyte specific gravity of an unsealed battery is typically determined by performing measurements directly at the cells of the battery using a conventional hydrometer float. Such measurements are very time consuming and also potentially hazardous due to the highly volatile gases that often escape from the battery cells.

The typical display on a hydrometer provides a specific gravity reading that is accurate to approximately 10 percent. Further, before a specific gravity value can be interpreted for determining operating conditions in a charge storage system, the specific gravity value on the display may need to be adjusted to compensate for variations in temperature. As a result, for safety and accuracy reasons, a conventional hydrometer float is not generally used for testing the charge storage system in a vehicle.

It is most common that testing of a vehicle charge storage system is performed by measuring the potential difference at the terminals of a battery in a vehicle. This measurement is typically performed when the battery is in an open circuit condition. The open circuit terminal voltage (OCTV) of a battery may be converted into a battery percent charge level, which provides an indication of battery operating condition. See, detailed discussion below.

Charge storage system testing devices and, specifically battery testing devices, which perform OCTV measurements often require periodic recalibration and typically do not include electronics and displays for providing highly accurate readings of the battery percent charge level for expected values. The battery testing industry, for example, uses battery testing devices which include a programmed microprocessor unit that models the internal resistance and capacitance of the battery from OCTV measurements for purposes of providing an indication of battery internal resistance and charge level. These testing devices, however, are typically too costly or too large in size to allow for practical use by the public.

A need, therefore, exists for an economical, convenient, safe and accurate method and apparatus for determining the charge level and health of vehicle charging system components.

SUMMARY OF THE INVENTION

In accordance with the present invention, a test meter for testing a charge storage system, which includes the battery and alternator, in a vehicle is provided. The test meter includes a measurement circuit for measuring the open circuit and loaded terminal voltage of the battery and a display connected to the output of the measurement circuit for displaying indicators of the operating condition of the charge storage system based upon open circuit, loaded and alternator generated terminal voltages. The output of the measurement circuit responds only when the terminal voltage of the battery exceeds a threshold level, for instance 8 volts d.c. during vehicle start, and varies in linear relation to all terminal voltages above this threshold value. Thus, a full meter scale display of voltages, for instance, between 8 and 14 volts d.c., is therefore made possible. The measurement circuit also includes an output damper to limit the large, rapid output variations experienced during vehicle start and circuitry for compensating for variations in circuit performance due to temperature variations.

Further features and advantages of the present invention will become readily apparent to those of ordinary skill in the art by reference to the following detailed description and accompanying drawings.

DETAILED DESCRIPTION

Figure 1:
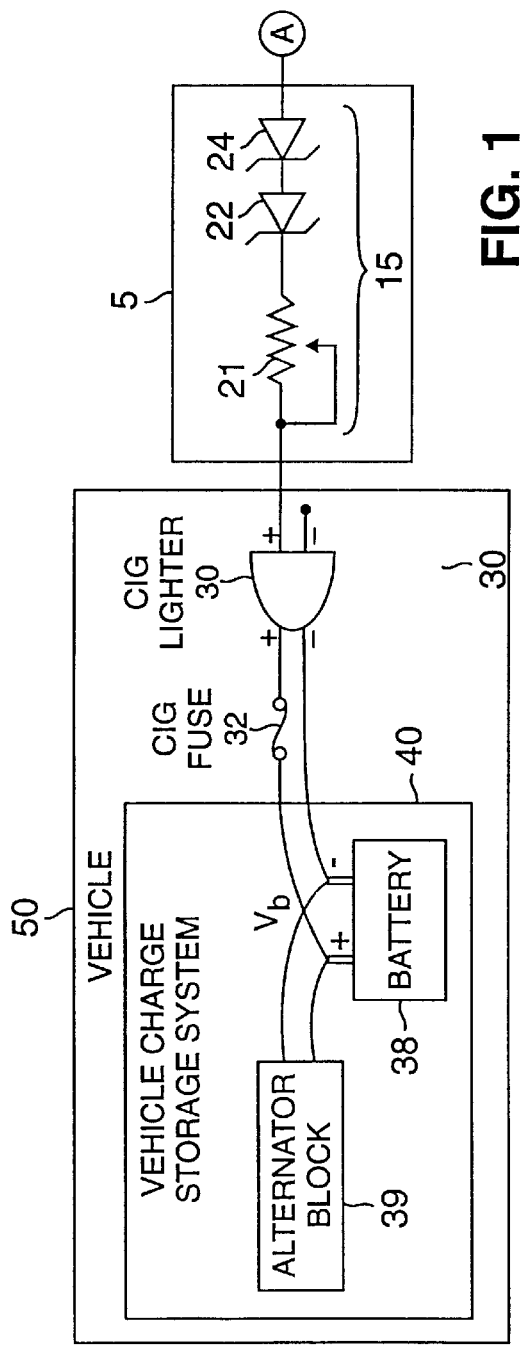
FIG. 1 illustrates an exemplary Scale Expander Circuit for testing a vehicle charge storage system in accordance with the present invention.

FIG. 1 shows an exemplary embodiment of a Scale Expander Circuit (SEC) 5 which may be suitably used for detecting the potential difference at the terminals of a battery for testing the operating condition of components in a vehicle charge storage system. Advantageously, this circuit expands a selected segment at the top end of a voltage source so that the selected segment may be displayed over the entire scale of an analog meter or on a digital display. Thus, expected values for the tested voltage may be more accurately measured and displayed.

Referring to FIG. 1, the SEC 5 may suitably include a voltage expander path 15 which comprises a series connection of a potentiometer 21 and two zener diodes 22 and 24. The potentiometer 21 of the path 15 is an input to the SEC 5, and is suitably connected to the terminals of a battery in a vehicle as explained in detail below. The anode of the zener diode 24 is connected to an output A of the SEC 5. As more fully discussed below, the output A may be suitably connected to any type of electronic circuit block (e.g., analog meter, LED's or digital display) which provides indications of the operating condition of components in a vehicle charge storage system based on measurements performed at the terminals of a battery using the SEC 5.

In one embodiment of the present invention, the potentiometer 21 may be suitably connected across the terminals of a battery in a vehicle charge storage system via a remote connection. This remote connection to a battery provides for safe monitoring of charge storage system operating conditions using a simple, accurate and compact charge storage system monitoring device in accordance with the present invention. For example, the SEC 5 may be suitably connected to any convenient location in a vehicle, such as an accessory fuse terminal in the fuse panel of the vehicle, which permits measurement of the potential difference at the battery terminals.

In the preferred embodiment, the potentiometer 21 is connected to a battery 38 that is included in a vehicle charge storage system 40 of a vehicle 50 via a standard power outlet socket such as cigarette lighter socket 30, which is also included in the vehicle 50. The lighter socket 30 connects the input of the SEC 5 across the terminals of the battery 38 through a cigarette lighter fuse 32. The vehicle charge storage system 40 further includes an alternator block 39 which is coupled to the terminals of the battery 38 using standard techniques. For ease of reference, the potential difference across the terminals of the battery 38 is hereinafter referred to as $V_b$.

The SEC 5 detects a range of voltages $V_b$ that may appear at the terminals of the battery 38. In accordance with the present invention, the zener diodes 22 and 24 are operated above the reverse breakdown voltage (10.4 volts d.c.) to provide electrical levels at the output A which vary in linear relationship with the voltage levels $V_b$ above 11 volts d.c. which may appear at the battery 38 and be detected at the input to the SEC 5. Operation where $V_b$ is below 11 volts d.c. will not produce the linear circuit response required for obtaining an accurate measurement of the range of $V_b$ values that may be detected between full charge and discharge.

The zener diodes 22 and 24 and the potentiometer 21 in the path 15 operate in combination as a voltage switch that remains closed until $V_b$ is greater than 11 volts d.c. The switch opens at this point and the display is monitored for purposes of testing charge storage system operating conditions, for example, between 11 and 14 volts. The zener diodes 22 and 24 of the preferred embodiment are standard 5.2 volt Motorola 1N4689 types that act as a series switch having a 10.4 volt drop across it. The potentiometer 21 is suitably adjusted to provide that a voltage will appear at the output A, or a current level may be produced from the output A, only if $V_b$, measured as the OCTV or loaded terminal voltage at the battery 38, exceeds a pre-determined level. Further, the potentiometer 21 provides that a range of resistive loads may be inserted in the path 15 such that standard voltage or current detection devices may be connected to the output A of the SEC 5 for purposes of accurately testing the operating conditions of components in the vehicle charge storage system 40.

The SEC 5, thus, is elegant in its simplicity for providing the unique and novel advantage of operating as a voltage divider type of switch that linearly reduces the range of changes in potential difference at the battery terminals for measurement using a suitable detector and prevents the development of an electrical level at the output until a specific voltage is measured at the battery terminals. For example, the SEC 5 may be compensated by adjusting the value of the potentiometer 21 to accommodate the scale factor of a current detecting device, such as an ammeter, which is connected to the output A that will not begin to measure a current produced at the output A until a voltage equal to or greater than that of a fully charged battery is detected at the input to the SEC 5. In another aspect of the invention, described in greater detail below, the connection of a suitable voltage detecting means, such as an analog-to-digital converter or voltmeter, to the output A of the SEC 5 permits determination of the electrolytic specific gravity of a battery with high accuracy.

Figure 2:
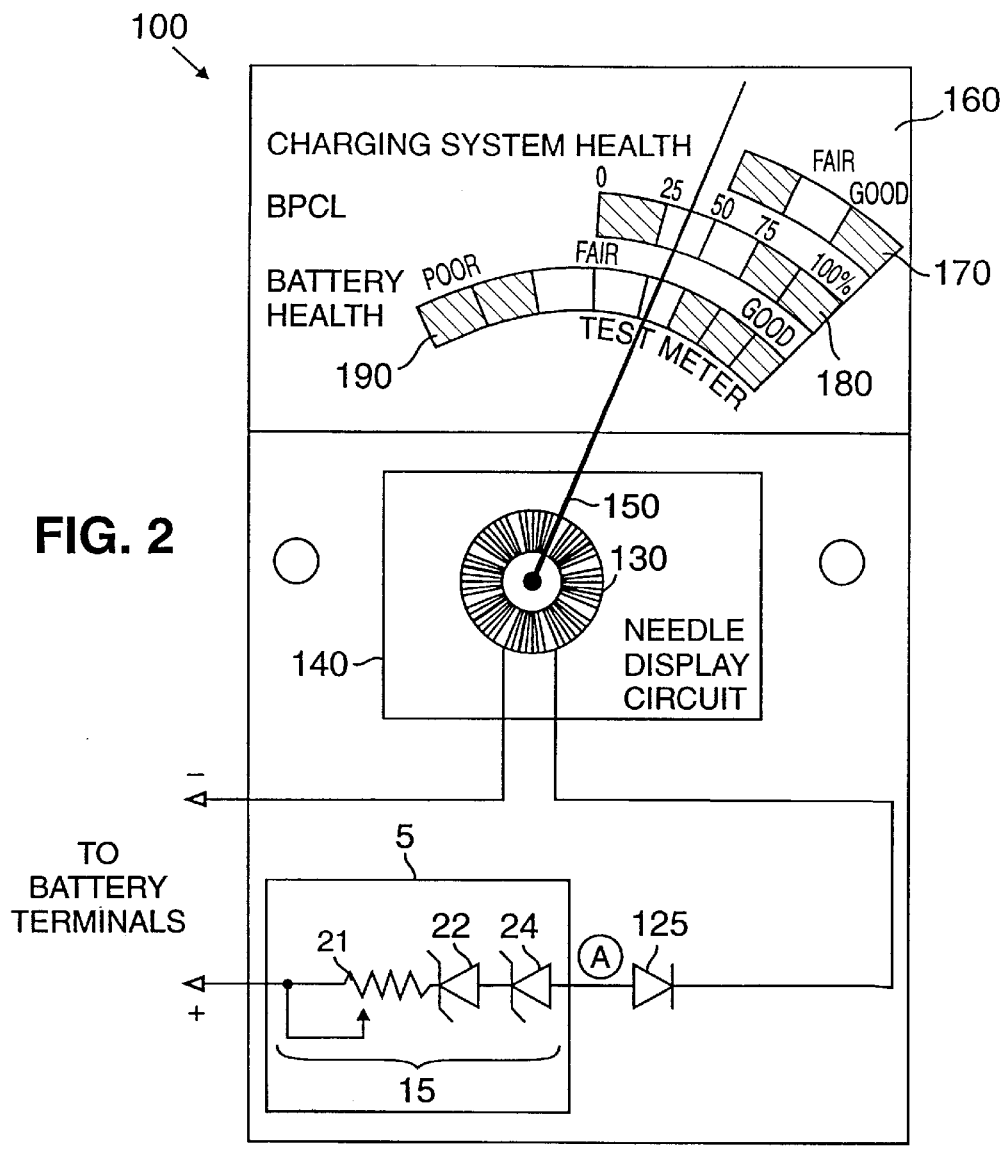
FIG. 2 illustrates an analog test meter which includes the circuit of FIG. 1 and three scales for providing an indication of the operating condition of a vehicle charge storage system in accordance with the present invention.

FIG. 2 illustrates a test meter (TM) 100 which includes the SEC 5 and may suitably provide indications of the following vehicle charge storage system operating conditions: (1) charging system health; (2) battery percent charge level (BPCL); and, (3) battery health. In accordance with the present invention, the TM 100 comprises the SEC 5 which is suitably connected to an analog display for performing remote measurement of the potential difference at a battery for purposes of accurately determining and displaying charge storage system operating conditions. For purposes of highlighting the advantages of the present invention, an explanation of the above-mentioned vehicle charge storage system operating conditions is initially provided. Then, the structure and operation of the TM 100, which provides for suitable connection of the SEC 5 to the battery 38, is explained in detail.

The health of a vehicle charging system is a general representation of the operating condition of the alternator block 39. The alternator block 39 may typically include devices such as an alternator belt, an output diode bridge and a voltage regulator which are connected to each other and ultimately the battery 38 in a well known manner. The alternator block 39 provides for charging of the battery 38 when the engine, not shown, of the vehicle 50 is running or idling. According to the present invention, the TM 100 may be utilized for indicating the health of the vehicle charging system based on measurements of $V_b$ which are performed using the SEC 5 when the engine of the vehicle 50 is running or idling, in other words, when the alternator block 39 should be charging the battery 38. It is well known that an alternator block that is operating properly, called a healthy charging system, will typically maintain the potential difference at the battery terminals between 13.6 and 14.8 volts d.c. as a function of ambient temperature.

The battery percent charge level (BPCL) is a well known indicator of the open terminal charge level of a battery. BPCL may be determined by measuring the potential difference at the battery terminals with no load applied and when the battery is not being charged. According to well established mathematical relationships, it can be shown that BPCL is directly proportional and varies linearly with open circuit terminal voltage (OCTV) at a battery. For a battery in satisfactory operating condition, an OCTV level of 11.89 volts d.c. corresponds to a fully discharged battery having a BPCL equal to 0%, and an OCTV level of 12.68 volts d.c. corresponds to a fully charged battery having a BPCL equal to 100%.

It should be noted that after charging has ceased, a topping voltage is retained in the electrolyte of a healthy battery for at least several hours or more, unless removed with an appropriate discharge current level. In moderate climates, for example, OCTV will remain at approximately 13.3 volts for at least ten hours after charging has ceased and, therefore, BPCL will remain near or slightly above 100% for this interval. It may, therefore, be desirable to remove this topping voltage using the method described below before measuring BPCL.

Battery health is a term common to the battery testing industry, and refers to the determination of battery internal resistance by measuring the open circuit potential difference across the battery terminals before and after a predetermined load is applied. A good battery must hold its topping voltage when the load is applied. A bad battery will not. It is well known that the topping voltage of a battery which is in marginal operating condition will dissipate almost immediately after charging ceases. For example, BPCL may decrease to between 70 and 90% after charging ceases, thereby suggesting that the battery may not be in satisfactory operating condition. In this case, battery operating condition may be determined by applying a selected accessory load to the battery in a vehicle before attempting to recharge the battery, i.e., before starting the engine. For example, before the engine is started, a head lamp or defog switch in a vehicle may be turned on for approximately one to two minutes. The terminal voltage of a healthy battery will remain at a level higher than a pre-determined threshold level when such a load is applied.

This pre-determined threshold level is related to the expected internal d.c. source resistance of a healthy battery. For a healthy battery, the source resistance is typically 0.03 ohms at full charge and 0.283 ohms at full discharge. However, for a malfunctioning or aged battery, the source resistance of the battery typically would exceed the above values, causing the terminal voltage at the battery to decrease below the pre-determined threshold level when a load is applied. A weak battery, for example, may have a source impedance equal to 0.06 ohms at full charge. Thus, the TM 100 provides for measurement of the source resistance of a battery when a load is applied for purposes of indicating battery health based on measurement of the potential difference at the battery terminals.

In accordance with the present invention, the TM 100 including the SEC 5 may suitably measure the potential difference at a battery for providing an indication of vehicle charge storage system operating conditions. In the preferred embodiment, $V_b$ is measured using the SEC 5 for accurately determining and displaying charge system health, battery percent charge level and battery health.

Referring to FIG. 2, the TM 100 may suitably comprise a diode 125 and a needle display circuit 140 connected in series to the output A of the SEC 5. The needle display circuit 140 comprises an ammeter winding resistance $R_w$, 130 connected to a deflecting needle 150. The deflecting needle 150 moves transversely across a display 160. The display 160 may suitably include scales having indicia for indicating vehicle charge storage system operating conditions (e.g., charge system health, battery percent charge level and/or battery health) based upon measurements of $V_b$ that are performed using the SEC 5 in accordance with the present invention.

The needle display circuit 140, including the ammeter winding resistance $R_w$ 130 and the needle 150 are standard components which are suitably connected for detecting current level through a circuit path, namely the path including the SEC 5 and ammeter winding resistance $R_w$ 130, and also for facilitating display of these measured levels on the display 160. For example, a 0 to 1 mA ammeter manufactured by Prime Instruments provides a suitable needle display circuit 140.

The diode 125, which connects the SEC 5 to the needle display circuit 140, provides temperature compensation for counteracting variations in zener break down voltage levels which may occur at the zener diodes 22 and 24 when $V_b$ measurements are performed at various temperatures. In the preferred embodiment, diode 125 is a standard signal diode 1N4001 or equivalent. It is to be understood that one or more diodes which are similar in structure and function to the diode 125 may be added in series with the diode 125 to provide for additional forward voltage drops, as may be required for coupling a highly sensitive current detection device to the SEC 5. Likewise, one or more resistors may also be added in series with the diode 125 for the same purpose.

Referring to FIG. 2, the display 160 may suitably include a charging system health scale 170, a battery percent charge level (BPCL) scale 180 and a battery health scale 190. In a preferred embodiment, the potentiometer 21 is suitably adjusted for calibrating the TM 100 based on the current levels which should be produced at the output A from OCTV measurements of a healthy battery.

Referring to FIG. 2, the scale 180 may suitably include indicia indicating BPCL between 0 to 100 percent. The scale 180 is preferably subdivided into three colored regions which, from left to right on the display 160, include a red region for 0–25% BPCL, a yellow region for 25–75% BPCL and a green region for 75–100% BPCL. The potentiometer 21 of the SEC 5 is suitably adjusted to produce current levels through the SEC 5 and the ammeter winding resistance 130 which cause the needle 150 to deflect linearly across the range of the scale 180 and indicate BPCL's between 0 and 100% that vary linearly in relation to detected levels of $V_b$, or OCTV values between 11.89 and 12.68 volts. As a result, the needle 150 would deflect through the red region of scale 180 for values of $V_b$ between 11.89 and 12.09 volts, through the yellow region for values between 12.09 and 11.48 volts and through the green region for values above 12.48 volts.

For purposes of illustration, the potentiometer 21 may be selected as a 1 kohm device and the needle display circuit 140 may operate as a 0 to 1 mA full scale ammeter having an associated winding resistance $R_w$ preferably equal to 930 ohms. It has been experimentally shown that BPCL readings obtained using the TM 100 which contains these specific components are accurate to within 5% of the expected value.

The scale 170 is calibrated with reference to the scale 180 and in accordance with the well known principle that the terminal voltage of a battery undergoing alternator charge in moderate climates will vary between 13.6 and 14.8 volts. In the preferred embodiment shown in FIG. 2, the scale 170 includes written indicia of POOR in a red colored region which corresponds to deflection of the needle 150 for $V_b$ values measured between 12.28 and 12.5 volts, written indicia of FAIR in a yellow colored region corresponding to deflection of the needle 150 for $V_b$ values measured between 12.5 and 13 volts and written indicia of GOOD in a green colored region corresponding to deflection of the needle 150 for $V_b$ values measured between 13 and 14 volts.

The scale 190 is also calibrated with reference to the scale 180 and suitably includes indicia representative of battery health which are based on measurement of $V_b$ reduction when a load is applied to the battery 38. Scale 190 is based upon differences in needle movement after applying a predetermined accessory load. The test is only performed on a battery having a charge level above 75% (i.e., $V_b$=12.48 volts) on scale 180. Needle movement must be less than 10% of scale 190 from its position prior to load application.

Larger movement indicates the need for a service station check. The scale 190 includes written indicia of POOR in a red colored region below 11.7 volts, written indicia of FAIR in a yellow colored region between 11.7 and 12.3 volts and written indicia of GOOD in a green colored region between 12.3 and 14 volts.

It is noted that the scales 180 and 190 utilize different measurements for providing information concerning the operating condition of a battery. The scale 180 utilizes OCTV measurements to indicate BPCL, whereas the scale 190 utilizes terminal voltage levels obtained when a load is applied to the battery. For example, on the BPCL scale 180, a $V_b$ measurement of 12.0 volts corresponds to an indication of a partially discharged battery, whereas, on the scale 190, a $V_b$ measurement of 12.0 volts is representative of the internal source resistance of the battery, which is an indicator of battery health.

In one embodiment of the TM 100 an announcer, not shown, may be included as part of the needle display circuit 140 for providing an audible indication, such as a beeping sound, when an OCTV measurement is made and the needle 150, deflects into the yellow region or BPCL is between 25–75%. This audible indication would inform a user that the battery operating condition is suspect.

The TM 100 may be used in the following manner for testing battery operating condition using the scale 180. For example, when an automobile is operated only on short distance trips, charging of the battery may not last for a sufficient time to allow for full charge of the battery. In this case, measurement of the battery using the TM 100 may typically result in the needle 150 deflecting to the yellow region of the scale 180. This lower BPCL reading does not necessarily indicate the battery is not healthy, rather, the battery may merely need to be fully charged to ensure that sufficient charge is available at the battery for starting the engine at a later time.

The scale 180 further may be utilized for providing BPCL readings after the topping voltage is removed from the battery terminals. After charging ceases, the topping voltage may either dissipate naturally or be removed manually or automatically using an automatic discharge circuit which applies at least a 10 ampere discharge current load to the battery 38. In an alternative embodiment, the TM 100 may be modified to include a topping voltage removal circuit which includes either an actuating solid state switch or relay that automatically places and maintains a load (e.g., vehicle defogger or headlights) on the battery terminals until the topping voltage is suitably removed, that is $V_b$ is reduced to 12.68 volts. At this point, BPCL can be accurately determined for providing an indication of battery condition.

In addition, the scale 180 may be used for determining whether some cells of the battery are shorted and, therefore, cannot maintain a charge. When this condition exists, after charging ceases, the OCTV at the battery typically will not be maintained at a level above 12.46 volts. Therefore, BPCL will always read 75% or lower on the scale 180 immediately after charging ceases, as the OCTV will quickly drop to a lower than expected level. If this occurs, further testing using the scale 190 is necessary, as explained below.

The scale 190 provides for measurement of battery health based on the well known fact that the source resistance of a healthy, fully charged battery is typically 0.03 ohms. As described above, battery health may be measured by manually or automatically applying a selected accessory load, such as a head lamp or defog current or depressing the brake pedal to operate the brake lights, to the battery for approximately one to two minutes after charging ceases. A healthy battery which is under load will maintain its terminal voltage at a level higher than a predetermined voltage level. The left-most portion of the yellow region of the scale 190 corresponds to the pre-determined threshold level. Deflection of the needle 150 to the left of this level indicates a battery that is not healthy. For example, application of a load to an aging or partially charged battery would probably result in a lower $V_b$ reading than expected, thereby causing less current to be produced at the output A such that the needle 150 defects only into the red region of the scale 190. This reading indicates that the battery may not be healthy. The user, therefore, should attempt to recharge the battery by, for example, driving the vehicle for a substantial amount of time, and then repeat the battery health test.

In an alternative embodiment, the SEC 5 may be used in conjunction with a standard digital display device, LED driver and associated compensation resistor which are connected to the output A in place of the diode 125, the ammeter load 130, needle display circuit 140 and the display 160 for providing an indication of, for example, battery health and battery percent charge level using red and green colored LED's. For example, the potentiometer 21 may be adjusted with respect to the value of the compensation resistor for illuminating a green LED corresponding to a 100% BPCL reading, which is based on an OCTV measurement of 12.68 volts.

In another aspect of the present invention, the SEC 5 may be utilized for determining the specific gravity of a battery. It is well known that the OCTV of a battery may be measured for purposes of determining electrolytic specific gravity of a battery as OCTV and specific gravity levels vary linearly in relation to each other. This relationship, which is based on Nernst's Equation, may be expressed as follows:

$$OCTV = 11.76 + \frac{RT}{F} \ln\left(\frac{a_{H2SO4}}{a_{H2O}}\right) \quad (1)$$

where:
OCTV=Open Circuit Terminal Voltage
R=Rydberg Gas Constant
T=Temperature (°K)
F=Kinetic Activation Factor
$a_{H2SO4}$=Fraction Molar Concentration of Sulfuric Acid
$a_{H2O}$=Fraction Molar Concentration of Water
Substituting the appropriate constant values, Equation 1 may be reduced to:

$$OCTV = 11.76 + \frac{1.28}{300} T \ln\left(\frac{a_{H2SO4}}{a_{H2)}}\right) \quad (2)$$

In turn, Equation 2 may be rewritten as:

$$OCTV = 11.76 + 0.0043 T \ln(6.9(s.g. - 0.965)) \quad (3)$$

where s.g. is the specific gravity of the battery and typically varies between 1.100 and 1.265. This relationship has been verified empirically through many measurements by the industry. Thus, according to most established standards, for a healthy battery, OCTV equal to 12.68 volts corresponds to a specific gravity of 1.268 at 80° F.

Figure 3:
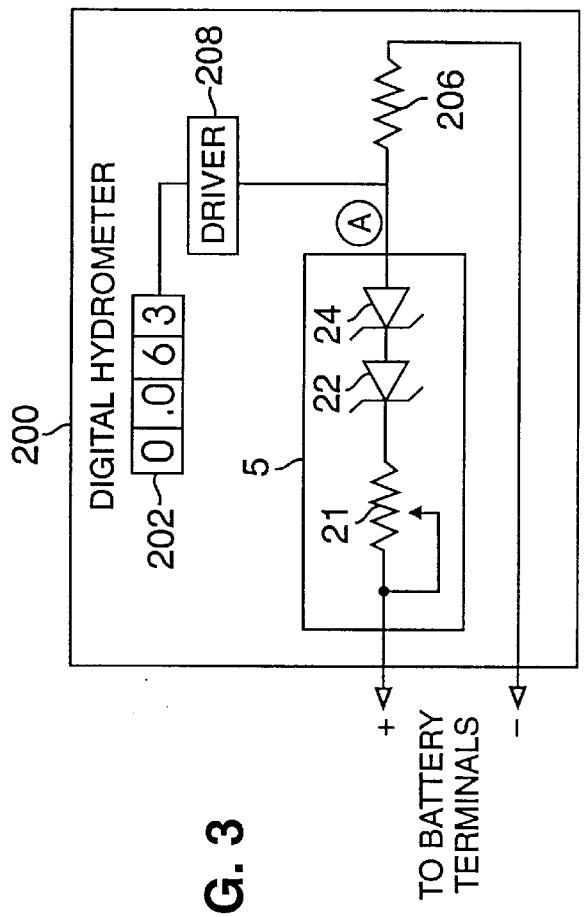
FIG. 3 illustrates a test meter which includes an alternate exemplary Scale Expander Circuit and provides an indication of the specific gravity of a battery in accordance with the present invention.

FIG. 3 shows an embodiment of a Digital Hydrometer (DHM) 200 including the SEC 5 and driver circuit 208 for providing digital readings of the electrolytic specific gravity of a battery on a digital display 202. The driver circuit 208 in combination with the SEC 5 permits that a specific gravity reading may be performed on sealed batteries without the need for performing measurements directly at the cells of a battery, as the required measurements of the battery may be performed safely and accurately through remote measurement of the voltage at the battery terminals using the cigarette lighter socket 30 or like devices. A conventional hydrometer float, by contrast, is generally not calibrated to provide electrolytic specific gravity readings above 1.400, which corresponds to an OCTV level of 13.2 volts. Referring to FIG. 3 the DHM 200 suitably comprises SEC 5 connected in parallel to a driver circuit 208 and a load resistance 206. Driver circuit 208, in turn is connected to a four digit display 202.

Figure 5:
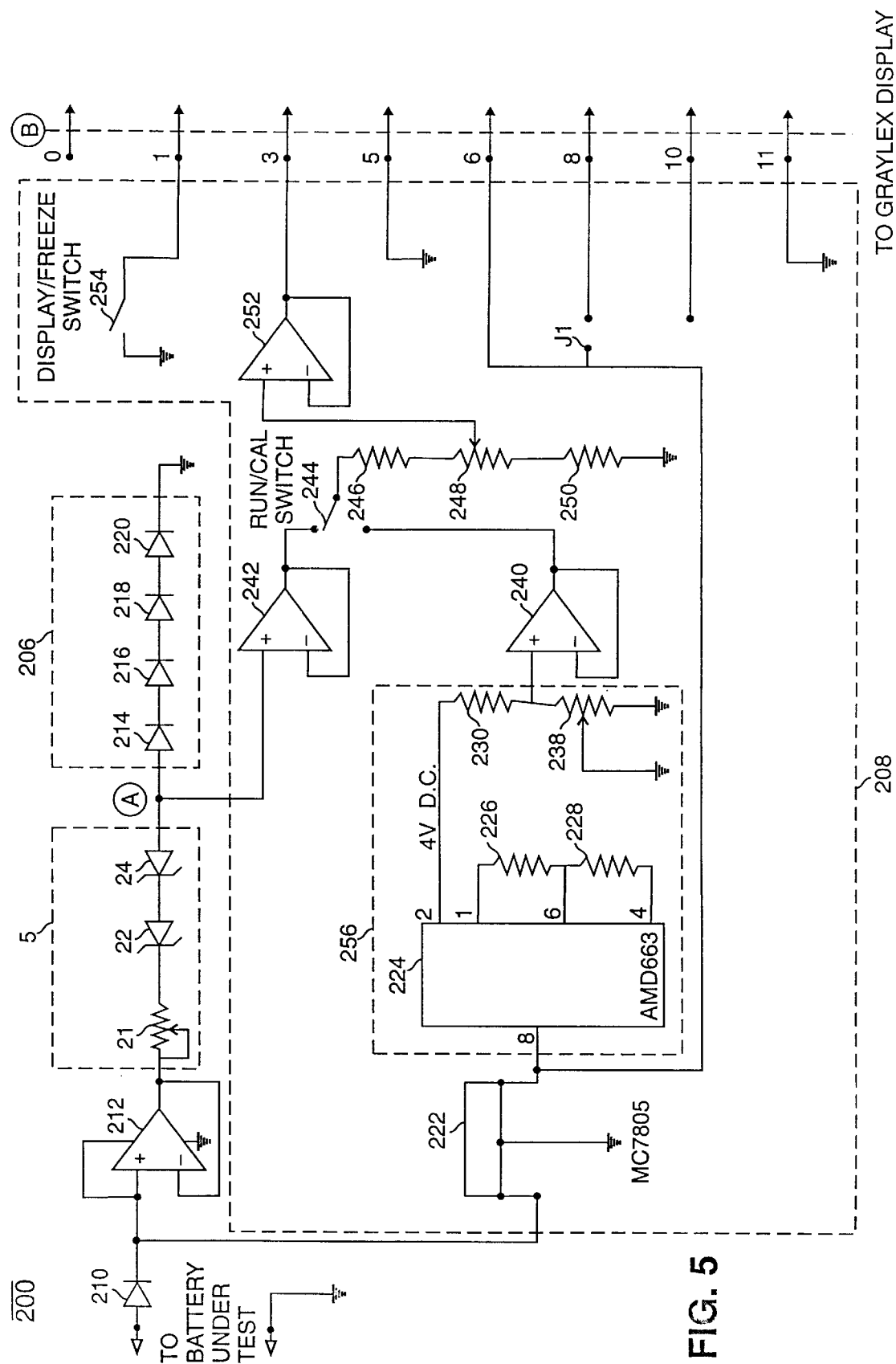
FIG. 5 illustrates a specific embodiment of the test meter of FIG. 3.

One specific embodiment of the DHM 200, depicted in FIG. 5, includes diode 210 and amplifier 212 connected in series to the input of SEC 5. Amplifier 212 is connected as a voltage follower with its input tied to B+ to act as a current source thereby widening the measurement range of the DHM 200. Amplifier 212 (as well as amplifiers 240, 242 and 252) is preferably an op9O and diode 210 is a 1N4002 type. SEC 5 is identical to that described above in connection with TM 100 and load resistance 206 comprises 1N9148 diodes 214, 216, 218 and 220 connected in series.

As described above, output A from SEC 5 is input into driver circuit 208, which in this embodiment is designed to drive a Graylex Industries Model 30 four digit display (not shown). In addition, driver circuit 208 of FIG. 5 includes circuitry 256 to calibrate the digital display to accurately display the correct specific gravity based upon the measured OCTV. Switch 244 switches between the output of SEC 5 (i.e., from point A) and the output of calibrate circuit 256, each signal being routed through buffer amplifiers 242 and 240, respectively. The signal selected by switch 244 is routed through a voltage divider comprising a 2.2 kohm resistor 246, a 250 ohm potentiometer 248 and a 8.2 kohm resistor 250, to amplifier 252. The output from amplifier 252 drives the digital display.

In operation, the MC7805 voltage regulator 222, provides +5 volts d.c. to the Graylex display and to an ADM663 voltage regulator 224 of the calibrate circuit 256. Voltage regulator 224, in turn, is configured with resistors 226 and 228 being 180 kohms and 100 kohms, respectively, to provide an output of 4 volts d.c. The 4 volt signal is then run through a voltage divider comprised of 10 kohm resistor 230 and 10 kohm potentiometer 238 to provide a voltage which corresponds to the voltage level that exists at point A when the OCTV of a battery under test is 12.68 volts. In order to calibrate the circuit, switch 244 is switched to the calibrate position to select the output of calibrate circuit 256 through buffer amplifier 240. Potentiometer 238 is then adjusted so that the display reading is 1.265, which would be the approximate specific gravity of a fully charged battery (i.e., $V_b$=12.68 volts) at 80° F. Switch 244 may then be returned to the run position to select the output of SEC 5 and specific gravity measurements of a battery may be taken.

In one alternative of the present invention, the TM 100 and the DHM 200 may be manufactured as a stand alone, portable charge storage system testing devices. In another alternative embodiment, the DHM 200 and the TM 100 may be suitably included in a single portable device, where the respective voltage and current detection and display components may be independently connected to the output A of the SEC 5 for providing either a specific gravity reading or charge system operating condition indications.

Figure 4:
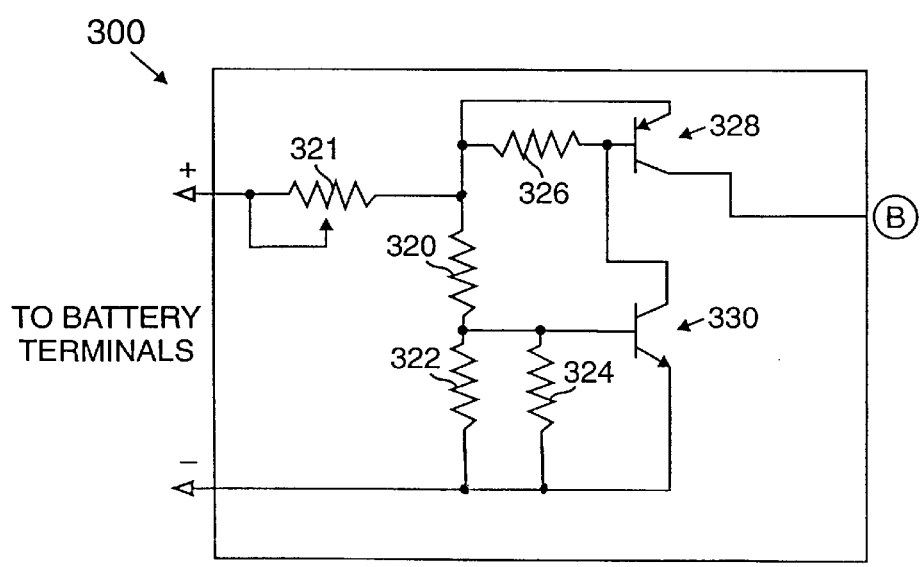
FIG. 4 illustrates an alternate exemplary Scale Expander Circuit for testing a vehicle charge storage system in accordance with the present invention.

FIG. 4 shows a Scale Expander Circuit (SEC) 300 which may be used in place of the SEC 5 in either the TM 100 or the DHM 200 for accurately measuring the potential difference at the terminals of a battery. The circuit 300 includes a potentiometer 321 which at a first end is suitably connected to a battery in the same manner as the potentiometer 21 of the SEC 5. The potentiometer 321 at a second end is connected to the collector of a PNP transistor 328. Further, the potentiometer 321 at the second end is connected in series with a resistor 326, which is connected to the base of the transistor 328, and in series with a resistor 320 which is connected to the base of a NPN transistor 330. A thermistor 322 and a resistor 324 connect the base of the transistor 330 to the ground return to the battery. The emitter of the transistor 330 is also connected to the ground return to the battery. The emitter of the transistor 328 is connected to an output B of the circuit 300.

In accordance with the present invention, the circuit 300 is operated over the breakdown region of the base-emitter diodes of the transistors 328 and 330 for obtaining a linear response at the output B for changes in $V_b$ which are measured at the input to the circuit 300. The thermistor 322 compensates for reduced current gain at a transistor at lower temperatures and increased current gain at a transistor at higher temperatures, as well as the decreasing battery voltage and increasing battery internal resistance with decreasing temperature. In other words, well known transistor operating characteristics are exploited in accordance with the present invention to provide that the current produced at the output A varies linearly in relation to $V_b$. The components in the circuit 300 are suitably selected for forward biasing the base of transistor 330 when $V_b$ is approximately 11.0 volts. Forward biasing the base of the transistor 330 causes the base-emitter diode of the transistor 330 to conduct current. This current, in turn, causes the base voltage of the transistor 328 to reduce sufficiently to cause forward biasing of the base-collector diode of the transistor 328. When this occurs, the emitter of the transistor 328 begins to conduct a current to the output B, which may be suitably connected to an ammeter in accordance with the present invention.

In the preferred embodiment transistors 328 and 330 are type 2N2904 and 2N2222, respectively, resistor 326 is 5 kohms, resistor 320 is 10 kohms, resistor 324 is 608 ohms and thermistor 322 is 2.7 kohms at 77° F. By adjusting potentiometer 321 to approximately 1.3 kohms, this circuit has been found to provide suitable output for an ammeter having a winding resistance of 930 ohms. In addition, SEC 300 produces the desired output characteristics at a significantly reduced cost as compared to the circuit of SEC 5.

The circuit 300 may be similarly connected in place of SEC 5 in the TM 100 as described above for the SEC 5, except that the diode 125 would not be included. Similarly, the circuit 300 may directly replace the SEC 5 in the DHM 200. For example, for the TM 100 including the circuit 300, the deflection needle 150 may be calibrated on the display 160 by adjusting the potentiometer 321 and selecting values for the resistors 324 and 320 of the voltage divider which provide a very small current response at the base of the transistor 330 in response to large voltage changes at the battery 38.

Figure 6:
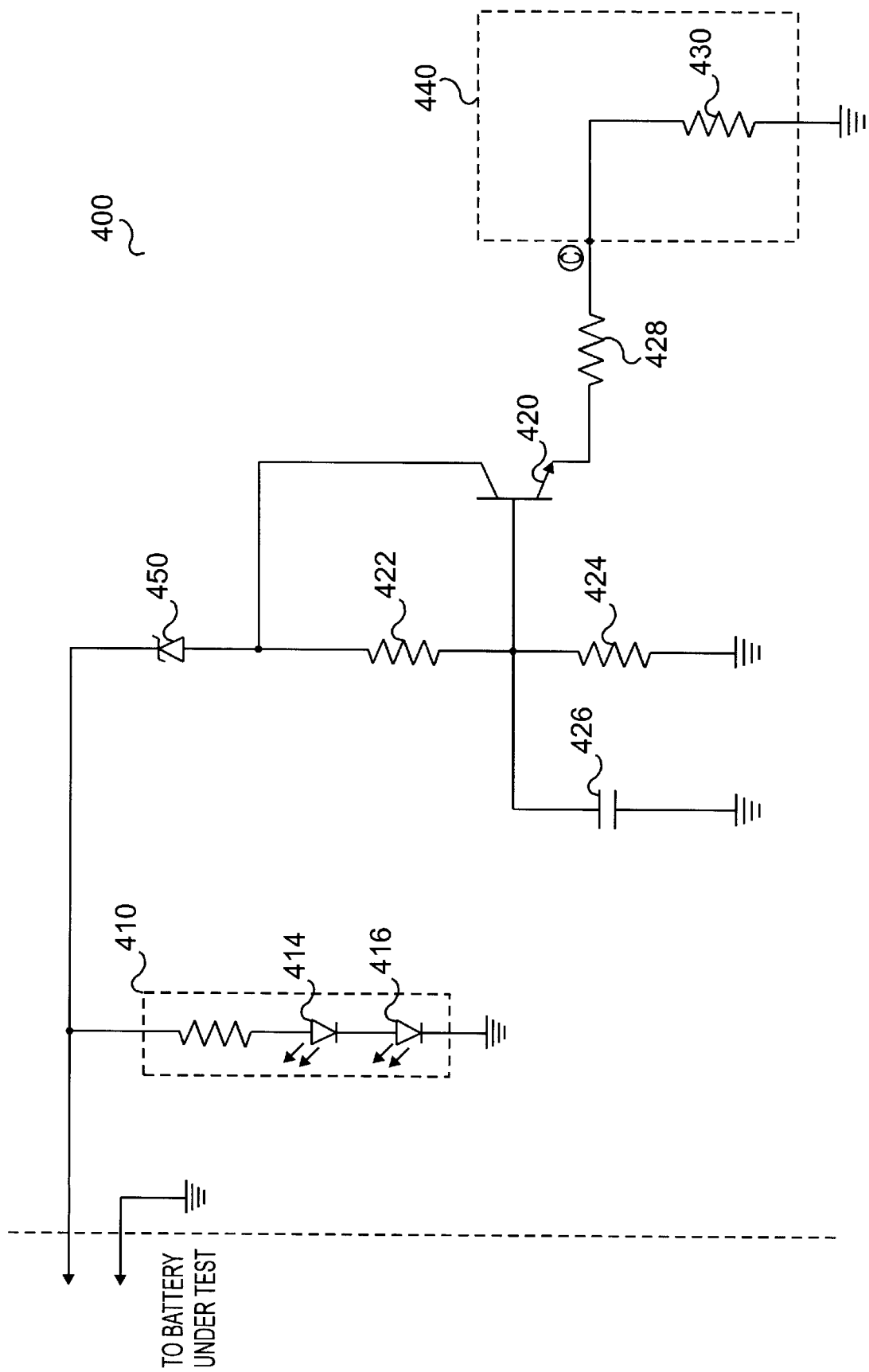
FIG. 6 illustrates an alternate exemplary Scale Expander Circuit having output damper circuitry.

FIG. 6 illustrates another alternate Scale Expander Circuit (SEC) 400, which may be used in a manner similar to the SEC's described above. SEC 400 uses a single zener diode 450 with its cathode forming the input from the vehicle charge storage system. The anode of the zener diode 450 is connected to the voltage divider circuit formed by thermistors 422 and 424. The base of an NPN transistor 420 is connected to the junction between thermistors 422 and 424, and its collector is connected to the junction between thermistor 422 and zener diode 450. A capacitor 426 is also connected between the junction of thermistors 422 and 424 and ground. Resistor 428, which is connected to the emitter of transistor 420, forms the output C of the SEC 400 and is connected to a 5 mA full deflection meter 440 having coil resistance 430. The meter 440 may include a display similar to display 160 shown in FIG. 2.

In operation, zener diode 450 (a type 1N4739 in the illustrated embodiment) provides a voltage drop of approximately 9 volts d.c. This prevents the transistor 420 (type 2N3904) from conducting until the battery voltage reaches approximately 9 volts d.c., thereby provides the desired scale expansion so that the meter 440 displays an output only between 9 and 14 volts d.c.

Thermistors 422 and 424 (1 kohm and 5 kohm at 25° C., respectively), together with transistor 420 provide temperature compensation for the SEC 400. At low temperatures the resistance of thermistor 424 increases sufficiently to cause transistor 420 to conduct more current to the ammeter 440 and increase its reading at low ambient temperatures as required to compensate for decreases in circuit gain. Conversely, at higher temperatures the resistance of thermistor 422 decreases, causing transistor 420 to conduct less current to meter 440 and decrease its reading to compensate for higher circuit gain at higher temperatures. This arrangement has been found to provide superior temperature compensation, particularly in the range of −25° C. to +125° C.

Capacitor 426 provides damping of the voltage at the base of transistor 420, and thus damps the output of the SEC 400. This limits the large, rapid variations of the current sent to meter 440, and consequently limits the large, rapid variations in the meter readout present, for example, when the engine starter of a vehicle is engaged. This allows the use of the engine starter as the load when testing the battery health (or cranking power) as described above. This has been found to provide more accurate results than using the headlights or other accessory load. In the illustrated embodiment, a 3,000 µF capacitor is used for capacitor 426.

Optionally, any of the meters described herein may include a light to illuminate the display and facilitate easy reading at night. In FIG. 6, illumination circuit 410 is provided and includes a 500 ohm resistor 412 connected in series with two LED's. The LED's may be appropriately mounted about the display of a connected meter to illuminate the face. It should be apparent, however, that other illumination circuits may be utilized, for example, an incandescent bulb.

Figure 7:
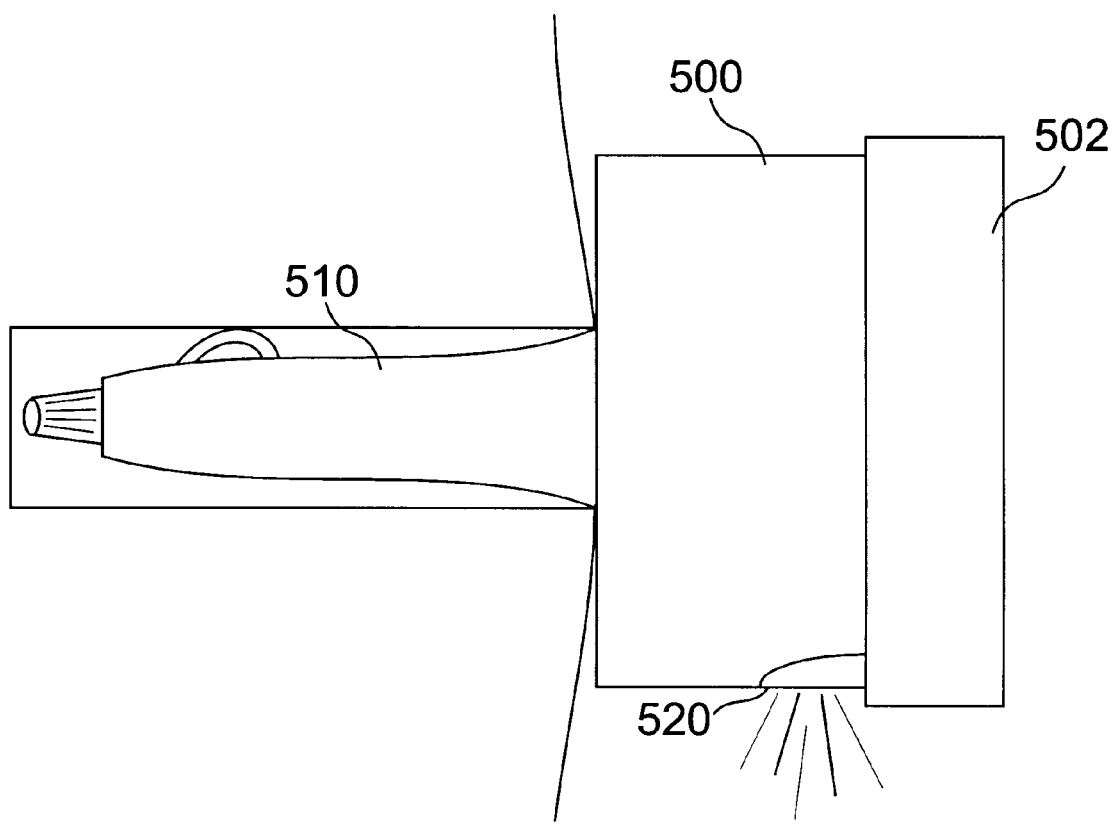
FIG. 7 is a side elevational view of a test meter according to the present invention.

In addition to, or in place of, the illumination circuit described herein, a map light may also be provided as an integral part of the test meter. One exemplary configuration, shown in FIG. 7, is to mount the SEC circuitry in a housing 500 and mount the display 502 of an analog meter to the front of the housing 500. A cigarette lighter plug 510 is mounted to the back of the housing 500 and the map light 520 is mounted to the bottom of the unit.

It is to be understood that the embodiments and variations shown and described above are illustrative of the principles of this invention only and that various modifications may be implemented by those skilled in the art without departing from the scope and spirit of the invention.

What is claimed is:

1. An apparatus for testing a charge storage system in a vehicle, said apparatus comprising:
    a measurement circuit for measuring a terminal voltage of a battery in the vehicle, said circuit providing an output which varies in linear relation to the terminal voltage of the battery within an expected range of voltages, wherein said output is provided only when the terminal voltage of the battery exceeds a threshold level;
    a display circuit for indicating at least one charge storage system operating condition based on the terminal voltage of the battery, said display circuit being electrically connected to the output of the measurement circuit; and
    an output damping circuit electrically connected to said measurement circuit for damping variations in said output.

2. The apparatus of claim 1 wherein said damping circuit comprises a capacitor.

3. The apparatus of claim 1 wherein said measurement circuit further comprises a temperature compensation circuit electrically connected to said measurement circuit to compensate for variations in the output due to variations in temperature.

4. The apparatus of claim 3 wherein said temperature compensation circuit comprises:
    a voltage divider circuit formed by at least two thermistors; and
    a transistor electrically connected to said voltage divider circuit.

5. The apparatus of claim 4 wherein said output damping circuit comprises a capacitor electrically connected to said measurement circuit.

6. The apparatus of claim 5 wherein said output damping circuit comprises a capacitor electrically connected to said voltage divider circuit.

7. The apparatus of claim 5 wherein said display circuit comprises an ammeter.

8. The apparatus of claim 7 wherein said measurement circuit comprises a zener diode.

9. The apparatus of claim 3 further comprising a map light mounted to a housing, wherein said measurement circuit, said temperature compensation circuit and said display circuit are mounted to said housing.

10. The apparatus of claim 1 further comprising a map light mounted to a housing, wherein said measurement circuit and said display circuit are mounted to said housing.

11. An apparatus for testing a charge storage system in a vehicle, said apparatus comprising:
    a measurement circuit for measuring a terminal voltage of a battery in the vehicle, said circuit providing an output which varies in linear relation to the terminal voltage of the battery within an expected range of voltages, wherein said output is provided only when the terminal voltage of the battery exceeds a threshold level;
    a display circuit for indicating at least one charge storage system operating condition based on the terminal voltage of the battery, said display circuit being electrically connected to the output of the measurement circuit; and
    a temperature compensation circuit to compensate for variations in the output due to variations in temperature, said compensation circuit electrically connected to said measurement circuit.

12. The apparatus of claim 11 wherein said temperature compensation circuit comprises:
    a voltage divider circuit formed by at least two thermistors; and
    a transistor electrically connected to said voltage divider circuit.

13. The apparatus of claim 11 further comprising a map light mounted to a housing, wherein said measurement circuit and said display circuit are mounted to said housing.

14. An apparatus for testing a charge storage system in a vehicle, said apparatus comprising:

a housing;

a measurement circuit for measuring a terminal voltage of a battery in the vehicle, said measurement circuit being mounted in said housing;

a display circuit mounted to said housing for indicating at least one charge storage system operating condition based on the terminal voltage of the battery, said display circuit being electrically connected to the output of the measurement circuit; and a map light mounted to the housing.

15. The apparatus of claim 14 wherein said measurement circuit provides an output which varies in linear relation to the terminal voltage of the battery within an expected range of voltages, wherein said output is provided only when the terminal voltage of the battery exceeds a threshold level.

16. An apparatus for testing a charge storage system in a vehicle, said apparatus comprising:

means for measuring a terminal voltage of a battery in the vehicle, said measuring means providing an output which varies in linear relation to the terminal voltage of the battery within an expected range of voltages, wherein said output is provided only when the terminal voltage of the battery exceeds a threshold level;

display means for indicating at least one charge storage system operating condition based on the terminal voltage of the battery, said display means being electrically connected to the output of the measuring means; and output damping means electrically connected to said measuring means for damping variations in said output.

17. The apparatus of claim 16 further comprising means to compensate for variations in the output due to variations in temperature, said compensation means electrically connected to said measuring means.

18. The apparatus of claim 17 further comprising a map light means mounted to a housing means, wherein said measuring means, said temperature compensation means and said display means are mounted to said housing means.

19. The apparatus of claim 16 further comprising a map light means mounted to a housing means, wherein said measuring means and said display means are mounted to said housing means.

20. A method for testing a charge storage system in a vehicle, said method comprising:

electrically connecting a test meter to a battery wherein said test meter includes a display having at least one scale for displaying at least one charge storage system operating condition, a measuring circuit which provides an output that varies in linear relation to a terminal voltage of the battery within an expected range of voltages, wherein said output is provided only when the terminal voltage of the battery exceeds a threshold level, and an output damping circuit electrically connected to said measurement circuit for damping variations in said output;

measuring the terminal voltage of the battery using said test meter;

determining at least one charge storage system operating condition based on the terminal voltage of the battery; and displaying said at least one charge storage system operating condition on said at least one scale.

21. The method of claim 20 further comprising the step of applying a load to said charge storage system.

22. The method of claim 21 wherein the step of applying a load comprises engaging a vehicle starter motor.

* * * * *